US012057867B2

United States Patent
Tan et al.

(10) Patent No.: US 12,057,867 B2
(45) Date of Patent: Aug. 6, 2024

(54) POWER MIXER HAVING HIGH LINEARITY TRANSCONDUCTANCE, TRANSMITTER AND RF TRANSCEIVER

(71) Applicant: HANGZHOU GEO-CHIP TECHNOLOGY CO., LTD., Hangzhou (CN)

(72) Inventors: Chun Geik Tan, San Diego, CA (US); Sy-Chyuan Hwu, Hangzhou (CN); Yewen Zhou, Hangzhou (CN)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 0 days.

(21) Appl. No.: 18/499,395

(22) Filed: Nov. 1, 2023

(65) Prior Publication Data

US 2024/0146344 A1    May 2, 2024

(30) Foreign Application Priority Data

Nov. 2, 2022    (CN) .......................... 202211359590.8

(51) Int. Cl.
  *H04H 60/91*    (2008.01)
  *H03D 7/14*    (2006.01)
  *H04B 1/04*    (2006.01)
(52) U.S. Cl.
  CPC .............. *H04B 1/04* (2013.01); *H03D 7/1425* (2013.01); *H04B 2001/0408* (2013.01)
(58) Field of Classification Search
  CPC ......... H03D 2200/0084; H03D 7/1433; H03D 7/1441; H03D 7/1458; H03D 7/1483;
  (Continued)

(56) References Cited

U.S. PATENT DOCUMENTS

2003/0017816 A1    1/2003  Souetinov
2003/0228858 A1    12/2003  Zhang et al.
(Continued)

FOREIGN PATENT DOCUMENTS

CN    101902202 A    12/2010
CN    102075145 A    5/2011
(Continued)

OTHER PUBLICATIONS

Notification of the First Office Action mailed Dec. 14, 2022 in Chinese Application No. 202211359590.8, with English translation, 17 pages.

(Continued)

*Primary Examiner* — Tan H Trinh
(74) *Attorney, Agent, or Firm* — Nixon & Vanderhye P.C.

(57) ABSTRACT

The present disclosure provides a power mixer having high-linearity transconductance, a transmitter and an RF transceiver. The power mixer having high-linearity transconductance comprises a power mixer and the following circuit structure: a mixer switching circuit having an output terminal directly connected to an input terminal of the power mixer; and a transconductance amplifier having an input terminal connected to an input terminal of the mixer switching circuit, wherein the output terminal of the mixer switching circuit supplies a current to the power mixer based on a voltage received by the transconductance amplifier from the input terminal of the mixer switching circuit.

6 Claims, 2 Drawing Sheets

(58) Field of Classification Search
CPC ....... H03D 7/1491; H03F 1/02; H03F 1/0261;
H03F 2200/18; H03F 2200/336; H03F
2200/405; H03F 2200/534; H03F
2200/537; H03F 2200/541; H03F
2203/45644; H03F 3/189; H03F 3/24;
H03F 3/245; H03F 3/45206; H04B
1/0475; H04B 2001/045
USPC .......................................................... 455/552
See application file for complete search history.

(56) References Cited

U.S. PATENT DOCUMENTS

| | | | | |
|---|---|---|---|---|
| 2005/0124311 | A1* | 6/2005 | Mahmoudi | H03D 7/1458 455/323 |
| 2006/0199562 | A1* | 9/2006 | Taylor | H03F 3/45179 455/333 |
| 2009/0088121 | A1* | 4/2009 | Xing | H03D 7/1441 455/319 |
| 2014/0018028 | A1* | 1/2014 | Lemkin | H03D 7/1441 455/313 |
| 2014/0155011 | A1* | 6/2014 | Ecklund | H04B 1/0025 455/230 |
| 2014/0235187 | A1* | 8/2014 | Vidojkovic | H03F 3/24 455/127.3 |
| 2015/0341080 | A1* | 11/2015 | Yamanouchi | H04B 1/74 370/228 |
| 2019/0044551 | A1* | 2/2019 | Dinc | H04B 1/0082 |

FOREIGN PATENT DOCUMENTS

| | | |
|---|---|---|
| CN | 102545786 A | 7/2012 |
| CN | 103684268 A | 3/2014 |
| CN | 106921346 A | 7/2017 |
| CN | 109995328 A | 7/2019 |
| CN | 217183258 U | 8/2022 |
| JP | 2005347828 A | 12/2005 |
| JP | 2012029206 A | 2/2012 |

OTHER PUBLICATIONS

Notification of the Second Office Action mailed Jan. 12, 2023 in Chinese Application No. 202211359590.8, with English translation, 13 pages.
Decision of Rejection mailed Feb. 11, 2023 in Chinese Application No. 202211359590.8, with English translation, 15 pages.
Notice of Granting Invention Patent mailed Jun. 15, 2023 in Chinese Application No. 202211359590.8, with English translation, 6 pages.

* cited by examiner

POWER MIXER HAVING HIGH LINEARITY TRANSCONDUCTANCE, TRANSMITTER AND RF TRANSCEIVER

CROSS-REFERENCE TO RELATED PATENT APPLICATION

This application claims the benefit of and priority to Chinese Patent Application No. 202211359590.8 filed on Nov. 2, 2022, the entire disclosure of which is incorporated by reference herein.

TECHNICAL FIELD

The present disclosure relates to the field of wireless communications, in particular relates to a power mixer having high-linearity transconductance, a transmitter and a Radio Frequency (RF) transceiver.

BACKGROUND

Currently, a current signal is required by a power mixer in an analog baseband portion of a transmission path of a transceiver, especially a Zero Intermediate Frequency (ZIF) transceiver, while a voltage signal is transmitted from a baseband filter. Therefore, a circuit for converting the voltage signal to the current signal is required.

In the prior art, a resistor, a circuit structure including a plurality of resistors, or a resistor-equivalent circuit is generally provided between the baseband filter and the power mixer to convert the voltage signal into the current signal.

However, such a conventional method has a drawback that the linearity of the current signal obtained by the conversion is poor, which is not desirable for the RF signal output.

SUMMARY

In order to effectively solve the related technical problem, the present disclosure provides a power mixer having high-linearity transconductance, a transmitter and an RF transceiver.

In an aspect, the present disclosure provides a power mixer having high-linearity transconductance, which includes a power mixer and a circuit structure, the circuit structure including: a mixer switching circuit having an output terminal directly connected to an input terminal of the power mixer; and a transconductance amplifier having an input terminal connected to an input terminal of the mixer switching circuit, where the output terminal of the mixer switching circuit supplies a current to the power mixer based on a voltage received by the transconductance amplifier from the input terminal of the mixer switching circuit.

An output terminal of the transconductance amplifier may be connected to a control terminal of the mixer switching circuit; and the output terminal of the mixer switching circuit may be specifically configured as a drain of a transistor, the input terminal of the mixer switching circuit may be specifically configured as a source of the transistor, and a control terminal of the mixer switching circuit may be specifically configured as a gate of the transistor.

A reference voltage input terminal of the transconductance amplifier may receive a reference voltage via a first resistor; the input terminal of the transconductance amplifier may be connected to the input terminal of the mixer switching circuit via a capacitor and a second resistor that are provided in parallel; and the input terminal of the mixer switching circuit may receive an inputted analog baseband signal via a third resistor.

When the power mixer further includes another input terminal, another circuit structure in a mirror-image arrangement with the circuit structure is provided.

In another aspect, the present disclosure provides a transmitter, which includes two power mixers having high-linearity transconductance according to some embodiments of the present disclosure, where output terminals of power mixers included in the two power mixers having high-linearity transconductance are jointly connected to a post-stage load within the transmitter.

In still another aspect, the present disclosure provides a transmitter, which includes two power mixers having high-linearity transconductance according to some other embodiments of the present disclosure, where respective two output terminals of power mixers included in the two power mixers having high-linearity transconductance are jointly connected to a post-stage load within the transmitter.

In yet another aspect, the present disclosure provides an RF transceiver, which includes the transmitter according to various embodiments.

The power mixer having high-linearity transconductance, the transmitter and the RF transceiver as proposed in the present disclosure have a rather high linearity compared to the prior art.

The above description is just a summary of the technical solutions of the present disclosure. In order to facilitate a better understanding of technical means of the present disclosure so that the present disclosure could be implemented in accordance with the description in the specification, and to render the above and other objects, features, and advantages of the present disclosure more clear, the specific embodiments of the present disclosure are given below.

BRIEF DESCRIPTION OF THE DRAWINGS

The aforesaid and other objects, features and advantages of exemplary embodiments of the present disclosure will be readily understood by reading the detailed description below with reference to the accompanying drawings. In the accompanying drawings, a number of embodiments of the present disclosure are illustrated in an exemplary rather than restrictive manner.

In the accompanying drawings, the same or corresponding reference signs indicate same or corresponding portions.

DETAILED DESCRIPTION

The principle and spirit of the present disclosure will be described below with reference to a number of exemplary embodiments. It shall be understood that these embodiments are given only for the purpose of facilitating better understanding of those skilled in the art for implementation of the present disclosure, and are not intended to limit the scope of the present disclosure in any way. Rather, these embodiments are provided to make the present disclosure more thorough and complete, and will fully convey the scope of the present disclosure to those skilled in the art.

The specific embodiments of the present disclosure will be further illustrated in detail in combination with the accompanying drawings hereinafter.

Embodiment 1

A conventional transmitter, particularly a ZIF transmitter, includes a digital baseband portion, an analog baseband portion, and an RF baseband portion. The conventional analog baseband portion typically includes a filter, a resistor-equivalent circuit, and a power mixer. Thus, within the conventional analog baseband portion, only the signal output from the filter is fed into the power mixer via the resistor-equivalent circuit. The present disclosure proposes a new circuit structure for replacing the resistor-equivalent circuit.

Figure 1:
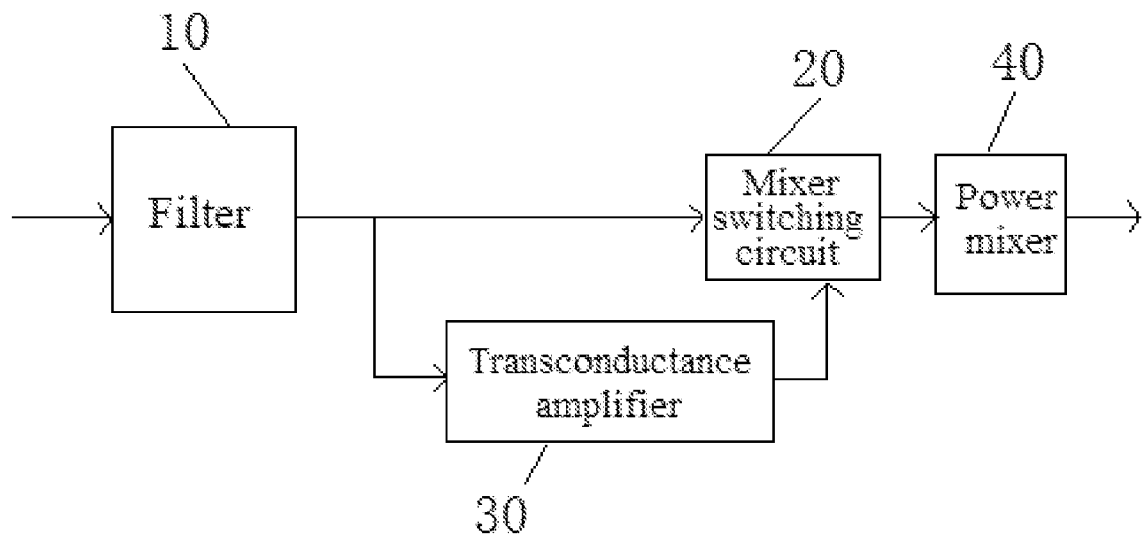
FIG. 1 is a block diagram illustrating an analog baseband portion in a transmitter according to embodiments of the present disclosure.

FIG. 1 is a block diagram illustrating an analog baseband portion in a transmitter according to embodiments of the present disclosure. As shown in FIG. 1, a filter 10, a mixer switching circuit 20, a transconductance amplifier 30, and a power mixer 40 are included. The mixer switching circuit 20 and the transconductance amplifier 30 receive signals from the filter 10. An output terminal of the mixer switching circuit 20 is connected to an input terminal of the power mixer 40. An output terminal of the transconductance amplifier 30 is connected to a control terminal of the mixer switching circuit 20. An output terminal of the mixer switching circuit 20 supplies a current to the power mixer 40 based on the voltage of the signal from the filter 10. The analog baseband portion as shown in FIG. 1 may be used to process one of the analog baseband signals in the transmitter (e.g., an I-phase analog baseband signal or a Q-phase analog baseband signal).

Embodiment 2

Figure 2:
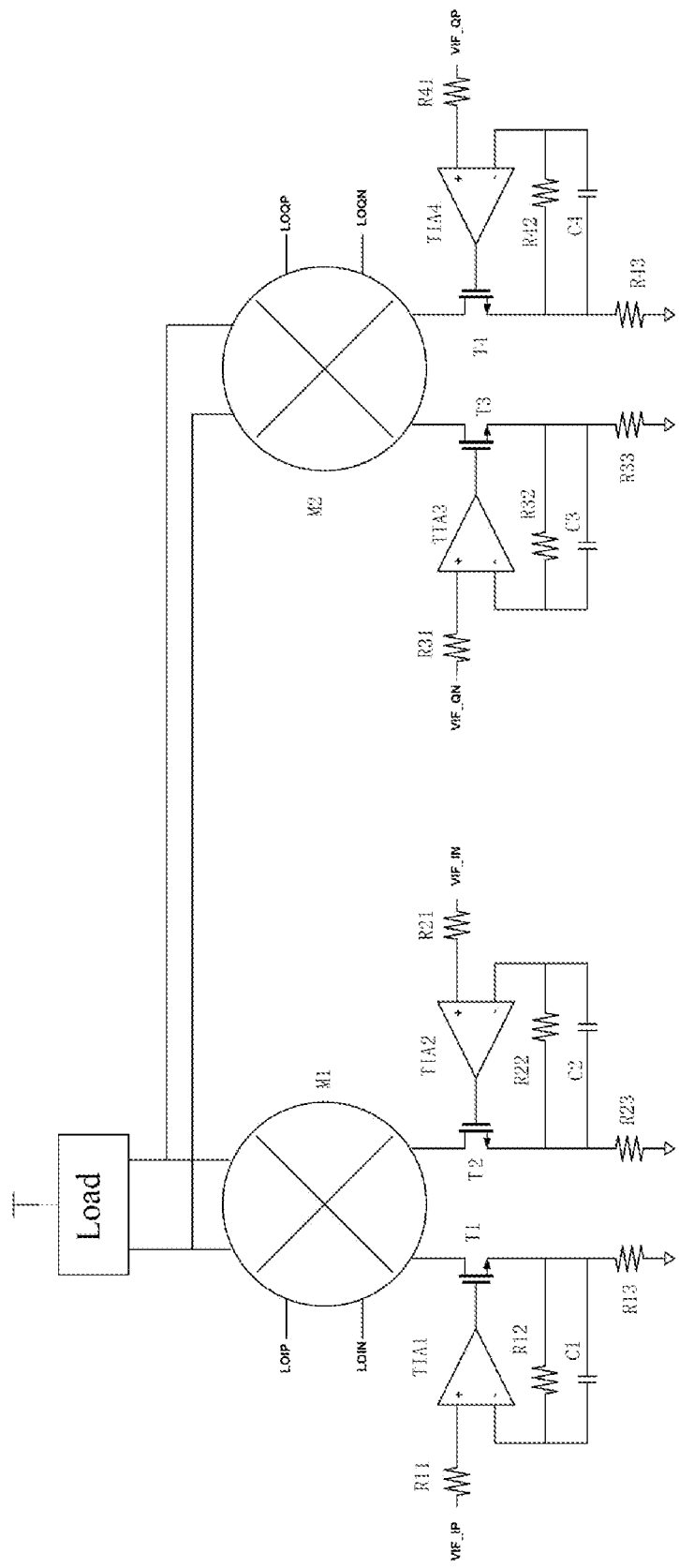
FIG. 2 is a detailed schematic diagram illustrating an analog baseband portion in a transmitter according to embodiments of the present disclosure.

FIG. 2 is a detailed schematic diagram illustrating an analog baseband portion in a transmitter according to embodiments of the present disclosure. In some embodiments, the transmitter may be a ZIF transmitter. The analog baseband portion includes a power mixer having high-linearity transconductance.

Specifically, FIG. 2 illustrates a first power mixer M1 and a second power mixer M2. The first power mixer M1 is configured to process the I-phase analog baseband signal, and the second power mixer M2 is configured to process the Q-phase analog baseband signal. The signal output terminals of the first power mixer M1 and the second power mixer M2 are jointly connected to a post-stage load in the transmission path. In this specification, the post-stage load refers to a load that the RF baseband portion and subsequent portions of the transmitter have.

In some embodiments, the first power mixer M1 includes two local oscillator signal input terminals for receiving local oscillator signals LOIP and LOIN. The first power mixer M1 further includes two analog baseband signal input terminals configured to be connected to a circuit unit proposed in the present disclosure. In some embodiments, the circuit unit may include two circuit structures which may be referred to as a first circuit structure and a second circuit structure, respectively, and the second circuit structure is in a mirror-image arrangement with the first circuit structure. In some embodiments, the circuit unit may include only one circuit structure. This circuit unit, together with the first power mixer M1, forms the power mixer having high-linearity transconductance according to the present disclosure.

In some embodiments, the second power mixer M2 includes two local oscillator signal input terminals for receiving local oscillator signals LOQP and LOQN. The second power mixer M2 further includes two analog baseband signal input terminals configured to be connected to a circuit unit proposed in the present disclosure. In some embodiments, the circuit unit may include two circuit structures which may be referred to as a third circuit structure and a fourth circuit structure, respectively, and the third circuit structure is in a mirror-image arrangement with the fourth circuit structure. In some embodiments, the circuit unit may include only one circuit structure. The circuit unit, together with the second power mixer M2, forms a power mixer having high-linearity transconductance according to the present disclosure.

In some embodiments, the power mixer having high-linearity transconductance, which includes the first power mixer M1, may be configured to process the I-phase analog baseband signal; and the power mixer having high-linearity transconductance, which includes the second power mixer M2, may be configured to process the Q-phase analog baseband signal.

In some embodiments, depending on the linearity requirements of the mixer in the transmit path, the respective transconductance amplifiers in the circuit structures may have the same or different transconductance gm. Furthermore, one portion of the respective transconductance amplifiers may have the same transconductance gm, and another portion of the respective transconductance amplifiers may have the different transconductance gm.

The aforesaid circuit structures have the exactly same components and differ from each other only in structure. Thus, the solution of the present disclosure is explained herein by taking the first circuit structure in the first power mixer M1 as an example.

For example, the first circuit structure may include a transconductance amplifier TIA1, a mixer switching circuit T1, a resistor R11, a resistor R12, a resistor R13, and a capacitor C1. In some embodiments, the source of the mixer switching circuit T1 is connected to a signal input terminal (which may for example be referred to as an input terminal P) of the first power mixer M1; the drain of the mixer switching circuit T1 is connected to an analog baseband signal input terminal via the resistor R13; and the gate of the mixer switching circuit T1 is connected to an output terminal of the transconductance amplifier TIA1. One input terminal of the transconductance amplifier TIA1 is connected to the reference voltage input terminal via the resistor R11 to receive the reference voltage VIF_IP, and another input terminal of the transconductance amplifier TIA1 is connected to the analog baseband signal input terminal via the resistor R12 and the capacitor C1 provided in parallel.

In some embodiments, the mixer switching circuit T1 may be implemented as a transistor. For example, the mixer switching circuit T1 may be implemented as a PMOS transistor or other transistors.

The transconductance amplifier TIA1 is configured to convert a signal from the analog baseband signal input terminal into a current signal, and the mixer switching circuit T1 applies a current to the first power mixer M1 based on the current signal. Thus, the transconductance amplifier TIA1 and the mixer switching circuit T1 may be equivalent to a current source which outputs an AC current having a high degree of linearity.

In some embodiments, the first circuit structure may be in a mirror-image arrangement with the second circuit structure, and the source of the mixer switching circuit T2 is connected to another signal input terminal (which may for example be referred to as an input terminal N) of the first power mixer M1.

Embodiment 3

The present disclosure also aims to protect an RF transceiver, in particular a ZIF transceiver. The RF transceiver may include an analog baseband portion in the transmitter according to Embodiment 1 or 2.

Since the circuit structure according to the present disclosure employs a transconductance amplifier, the linearity of the current outputted from the respective circuit structures of the present disclosure is higher as compared to the solution of the prior art employing a resistor, such that the RF signal outputted from the power mixer has a better performance.

Although the spirit and principles of the present disclosure have been described with reference to several embodiments, it shall be understood that the present disclosure is not limited to the embodiments as disclosed, nor does the division of the aspects imply that the features in those aspects cannot be combined for benefit, such division being for convenience of presentation only. The present disclosure is intended to cover various modifications and equivalent arrangements included within the spirit and scope of the appended claims.

What is claimed is:

1. A power mixer having high-linearity transconductance, comprising a power mixer and a circuit structure, the circuit structure comprising:
    a mixer switching circuit having an output terminal directly connected to an input terminal of the power mixer; and
    a transconductance amplifier having an input terminal connected to an input terminal of the mixer switching circuit, wherein the output terminal of the mixer switching circuit supplies a current to the power mixer based on a voltage received by the transconductance amplifier from the input terminal of the mixer switching circuit;
    wherein an output terminal of the transconductance amplifier is connected to a control terminal of the mixer switching circuit, the output terminal of the mixer switching circuit is configured as a drain of a transistor, the input terminal of the mixer switching circuit is configured as a source of the transistor, and the control terminal of the mixer switching circuit is configured as a gate of the transistor; and
    wherein a reference voltage input terminal of the transconductance amplifier is configured to receive a reference voltage via a first resistor; the input terminal of the transconductance amplifier is connected to the input terminal of the mixer switching circuit via a capacitor and a second resistor that are provided in parallel; the input terminal of the mixer switching circuit is configured to receive an inputted analog baseband signal via a third resistor; and the power mixer having high-linearity transconductance is used in an analog baseband portion of a transmitter that is a ZIF transmitter.

2. The power mixer having high-linearity transconductance according to claim 1, wherein when the power mixer further comprises another input terminal, another circuit structure in a mirror image arrangement with the circuit structure is provided.

3. A transmitter, comprising two power mixers having high-linearity transconductance according to claim 2, wherein respective two output terminals of power mixers included in the two power mixers having high-linearity transconductance are jointly connected to a post-stage load within the transmitter.

4. An RF transceiver, comprising a transmitter according to claim 3.

5. A transmitter, comprising two power mixers having high-linearity transconductance according to claim 1, wherein output terminals of power mixers included in the two power mixers having high-linearity transconductance are jointly connected to a post-stage load within the transmitter.

6. An RF transceiver, comprising a transmitter according to claim 5.

* * * * *